United States Patent [19]
Lee

[11] Patent Number: 5,272,480
[45] Date of Patent: Dec. 21, 1993

[54] TRACK AND HOLD CIRCUIT WITH CONTINUOUSLY SUPPRESSED JOSEPHSON EFFECT

[75] Inventor: Gregory S. Lee, Mountain View, Calif.

[73] Assignee: Hewlett-Packard Company, Palo Alto, Calif.

[21] Appl. No.: 931,183

[22] Filed: Aug. 17, 1992

[51] Int. Cl.$^5$ .............................................. H03M 1/12
[52] U.S. Cl. .................................. 341/133; 341/122
[58] Field of Search ............... 341/133, 122, 123, 124, 341/125, 155; 505/827

[56] References Cited

U.S. PATENT DOCUMENTS

| | | | |
|---|---|---|---|
| 3,764,905 | 10/1973 | Zappe | 324/102 |
| 3,936,809 | 2/1976 | Zappe | 340/173.1 |
| 3,983,419 | 9/1976 | Fang | 307/277 |
| 4,879,488 | 11/1989 | Silver | 341/171 |
| 4,940,983 | 7/1990 | Jones et al. | 341/171 |
| 4,956,642 | 9/1990 | Harada | 341/133 |
| 4,983,971 | 1/1991 | Przybysz et al. | 341/133 |
| 5,019,818 | 5/1991 | Lee | 341/133 |
| 5,099,152 | 3/1992 | Suzuki | 307/476 |

OTHER PUBLICATIONS

Go, Diane et al., "A Superconducting Analog Track-and-Hold Circuit," *IEEE Transactions on Electron Devices.*, vol. 35, No. 4, Apr. 1988.

Primary Examiner—A. D. Pellinen
Assistant Examiner—Brian K. Young

[57] ABSTRACT

A track and hold circuit for use with an analog signal quantizer, comprising a multiple of four superconductor-insulator-superconductor (SIS) junctions arranged in a bridge. A storage inductance is connected to opposite nodes of the bridge, with an analog signal input being orthogonally injected into the bridge. The SIS junctions are magnetically suppressed from reaching a superconducting, zero-voltage state, limiting switching of the SIS junctions between a subgap voltage, high differential resistive behavior and a low differential resistive behavior exhibited when a gap voltage is attained. Preferably, each SIS junction includes a magnet that suppresses the superconductivity. Alternatively, a control wire may be used to provide a magnetic field to suppress superconductivity.

18 Claims, 4 Drawing Sheets

TRACK AND HOLD CIRCUIT WITH CONTINUOUSLY SUPPRESSED JOSEPHSON EFFECT

DESCRIPTION

1. Technical Field

The present invention relates generally to superconducting circuits and more particularly to track and hold circuits for quantization by a superconducting analog-to-digital converter.

2. Background Art

Analog-to-digital (A/D) converters having Josephson junctions may be employed to achieve high-speed quantization of an analog signal. Such A/D converters are described in U.S. Pat. No. 5,019,818 to Lee, U.S. Pat. No. 4,983,971 to Przybysz et al., U.S. Pat. No. 4,956,642 to Harada and U.S. Pat. No. 4,879,488 to Silver. Each of the described A/D converters includes at least one superconducting quantum interference device (SQUID).

The simplest SQUID is one in which a single Josephson junction is connected across an inductor to form a superconducting loop. Typically, the loop exhibits a periodic and multi-valued relationship between current through the inductor and magnetic flux in the loop. An increase in the current will produce a quantum increase in the magnetic flux in the loop. Likewise, a decrease in current will result in a quantum decrease in the magnetic flux. A single flux quantum ($\phi_0$) is $2.07 \times 10^{-15}$ Weber. A current increment or decrement that is equal to the flux quantum divided by the value of the inductance of the loop will produce a measurable voltage pulse across the Josephson junction. The voltage pulses may be detected and counted, thereby allowing the SQUID to function as a quantizer. The quantized amount of flux will equal $n\Phi_0$, where n is an integer.

A Josephson junction includes an insulative layer between two superconductive layers. As is well known, operation of this tunnel junction includes a superconducting, zero-voltage state and a resistive, voltage state. The junction may be switched from a zero-voltage state to the voltage state by increasing the current through the junction to above a critical current. Resetting the junction to the zero-voltage state is accomplished by reducing the current to approximately zero. Alternatively, the switching operation can be accomplished by use of a control wire adjacent to the junction, as described in U.S. Pat. No. 3,936,809 to Zappe. Current through the control wire generates a magnetic field that can destroy the superconducting condition at a specific temperature.

FIG. 1 illustrates a current-voltage (I-V) characteristic of a Josephson junction. The superconducting, zero-voltage state is shown at 10. When in a resistive, voltage state the junction will attain a "gap voltage" ($V_g$) The gap voltage is $2\Delta/e$, where $2\Delta$ is the energy gap and e is electron charge. In a niobium tunnel junction, $V_g$ is approximately 3.0 mV. After the junction has attained the resistive, voltage state at $\pm V_g$, it will remain in that state until current is removed or reduced to a near zero level, thereby resetting the junction to the zero-voltage state.

None of the A/D converters in the above-cited patents to Lee, Przybysz et al., Harada and Silver describes use of a track and hold circuit, despite clear advantages of holding a current level of an analog signal during sampling. Particularly in the high-speed operation of superconducting A/D converters, a track and hold circuit can improve performance and accuracy. However, for reasons described below, track and hold circuits are not commonly used in superconducting devices.

One track and hold circuit is described in "A Superconducting Analog Track-and-Hold Circuit" by D. Go, which appears in *IEEE Transactions on Electron Devices*, Vol. 35, No. 4, April, 1988, pages 498-501. The circuit functions to capture a sample of an analog signal as a circulating current in a superconducting storage loop. A Josephson junction is used as a switch across an inductance. A clocked gate current is coupled to the Josephson junction and is used to suppress and restore the Josephson critical current. During tracking mode, the Josephson current is suppressed and the analog signal current flows through the inductor, typically to ground. At a sample time, the circuit is placed in hold mode by restoring the Josephson current. In the hold mode the Josephson junction is reset to its superconducting zero-voltage state, trapping the analog signal current level within the superconducting loop comprising the tunnel junction and the inductor. The magnetic flux that was within the superconducting loop at the sample time is held to the nearest flux quantum, $n\Phi_0$.

While this track and hold circuit operates well in ideal circumstances, there are difficulties associated with the operation. Consequently, typically A/D converters of the superconducting type do not include track and hold circuits. Superconducting A/D converters instead sample in an "on the fly" manner in which the analog signal current may be changing during sampling. This leads to timing problems, since the most significant bit (MSB) and the least significant bit (LSB) of a digital word representing an analog signal current should be derived from a current level at a particular sampling time, rather than from a fluctuating analog signal.

One difficulty with the above-described track and hold circuit involves dynamics. Josephson junctions are very fast and reliable when required to switch from the superconducting, zero-voltage state to the resistive, voltage state. However, in the reverse transition from the voltage state to the zero-voltage state, the Josephson junctions are typically slower and are sometimes unreliable. In a superconducting track and hold circuit, the reverse transition is made from the track mode to the hold mode. The reverse transition must be made rapidly, preferably within one picosecond. Dynamically, the Josephson junction may even fail to return to the superconducting, zero-voltage state if the analog signal slews too rapidly since the zero-voltage state is not the unique solution in a hysteretic Josephson junction. Particularly for large Josephson junctions, there may be a number of internal resonances, so that a junction may be oscillating at any one of these resonances rather than going to the superconducting, zero-voltage state. A nonhysteretic Josephson junction is less desirable in the track and hold circuit, because the lower shunt resistance of the junction will act to steal signal away from the storage inductor for a rapidly slewing analog signal.

Another nonideal characteristic of the Josephson track and hold circuit described above involves the circuit's property of storing magnetic flux in an integer number of flux quanta. In comparison, while a semiconductor track and hold circuit holds an integer number of electronic charges, the number of held electronic charges is so large that the A/D converter receives what for all intents and purposes is a continuous quantity. That is, in semiconductor circuits each LSB represents many fundamental charges. On the other hand, in a superconductor track and hold circuit, an LSB represents only a few flux quanta. The problem is that the quantization increment of the superconducting track and hold circuit is determined by one quantity, i.e. the storage inductance, while the quantization increment of the A/D converter is determined by another quantity, i.e., the mutual inductance of the SQUID. These quantization increments are in general incommensurate with each other, affecting the linearity of the A/D converter. The smallest held current of the superconducting track and hold circuit cannot be the smallest resolvable current in the A/D converter, or the analog-to-digital conversion will be unacceptably nonlinear. Thus, there is a fundamental trade-off between the linearity and the resolution-bandwidth performance of an A/D system having the above-described track and hold circuit.

It is an object of the present invention to provide a track and hold circuit for use in a superconducting system, wherein the circuit ensures a reliable and high-speed transition between a track mode and a hold mode and wherein the circuit does not adversely affect the linearity of the superconducting system.

SUMMARY OF THE INVENTION

The above object has been met by a track and hold circuit having superconductor-insulator-superconductor (SIS) junctions arranged in a bridge, but each of the SIS junctions is inhibited from entering a superconducting, zero-voltage state so that the switching of each SIS junction is limited between a high differential resistive behavior at subgap voltages and a low differential resistive behavior upon attaining the gap voltage of the SIS junction. A storage inductance is coupled across the bridge. The injection of an input signal to be sampled is orthogonal to the injection of a control clock. In hold mode, the SIS junctions are simultaneously switched to a low differential resistance behavior, effectively shorting any current increments from the storage inductance.

A Josephson effect in the SIS junctions is continuously suppressed by the generation of a magnetic field. In a preferred embodiment, each SIS junction is associated with a separate magnet located at the top of the junction. The magnet is about the size of the junction and is magnetized parallel to the junction so that the magnetic field lines easily thread the tunnel barrier, i.e., the insulator layer. Less preferred would be to generate the magnetic fields by use of a control wire conducting a constant current and located above or below the SIS junctions in which the Josephson effect is to be suppressed. Alternatively, the tunnel junctions may be fabricated to include paramagnetic impurities, thereby intrinsically destroying the Josephson effect. While a global magnetic field may be applied to the circuit to suppress the Josephson effect in the SIS junctions, this requires proper precautions to prevent disruption of the desired Josephson currents in surrounding circuitry, such as the A/D converter itself.

The bridge consists of four SIS junctions or a multiple of four such junctions. Each of four legs of the bridge contains at least one SIS junction. The storage inductance is connected to oppositely disposed first and third nodes of the bridge and the input signal to be sampled is injected at the first node and extracted at the third node. In track mode, the SIS junctions exhibit a high differential resistive behavior, so that analog signal current is directed to the storage inductance. In the hold mode, a clock input current injected at the second node and extracted at the fourth node causes transition of the SIS junctions from the high differential resistive behavior to a low differential resistive behavior. The transition causes any incremental changes of the analog current to be diverted from the storage inductance for conductance to the bridge. Thus, the storage inductance maintains a current level. Because the SIS junctions are not in a superconducting, zero-voltage state the incremental current changes will slowly leave the SIS junctions and flow into the storage inductance, but the leakage is sufficiently slow that sampling of the held current level is accomplished in sufficient time to avoid any detrimental effects.

In one embodiment of the track and hold circuit, the control clock is a floating clock connected at the second and fourth nodes of the bridge. In a second embodiment, the control clock is a single-ended clock coupled to the second node, while the fourth node is grounded.

An advantage of the present invention is that the SIS junctions are not required to enter the superconducting, zero-voltage state. Rather, the tunnel junctions are limited to high differential resistive behavior and low differential resistive behavior. Unlike Josephson track and hold circuits in which there may be a question as to whether Josephson junctions have reached a zero-voltage state rather than an internal resonant voltage, the present invention ensures reliable switching, since the SIS junctions need only attain the gap voltage when a clock current is applied.

Another advantage of the present invention is that because the loop formed by the bridge and the storage inductance does not reach a superconducting state, even in the hold mode, the signal current that is held is continuous, rather than quantized. Only the A/D converter performs quantization. Therefore, the question of whether a track and hold quantization increment is commensurate with a quantization increment of an A/D converter is not an issue. Moreover, the present invention provides high-speed performance (sub picosecond aperture uncertainty) with very high bandwidth signals (multi-gigahertz).

BEST MODE FOR CARRYING OUT THE INVENTION

Figure 2:
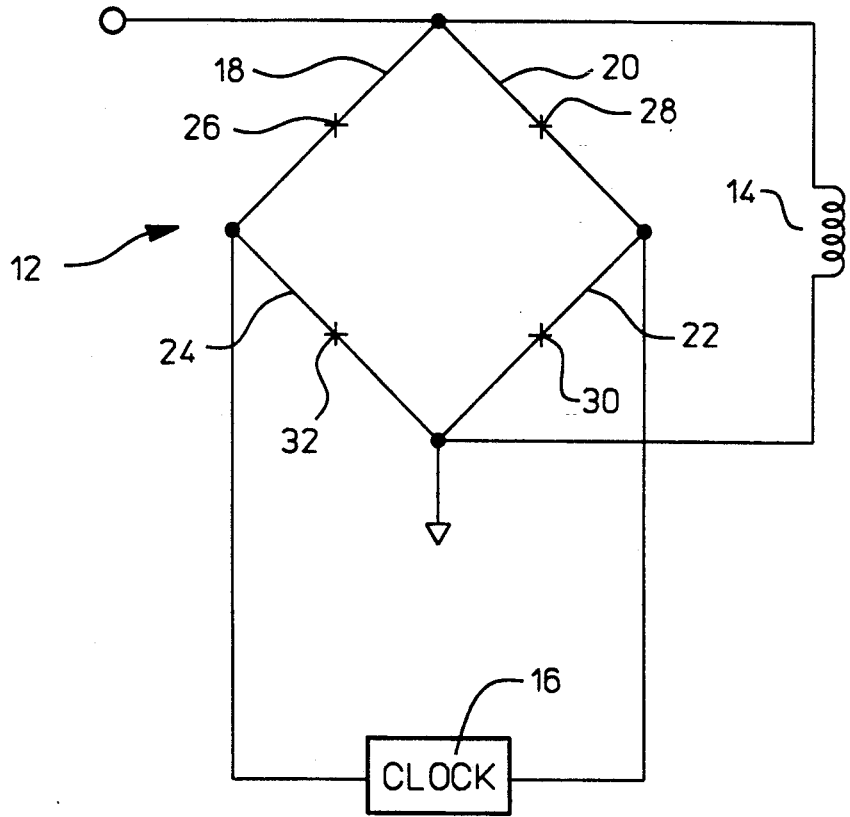
FIG. 2 is a schematic view of a first embodiment of a track and hold circuit in accordance with the present invention.

With reference to FIG. 2, a first embodiment of a track and hold circuit is shown as including a bridge 12, a storage inductor 14 and a clock input 16. The bridge includes four legs 18, 20, 22 and 24, with each leg having a superconductor-insulator-superconductor (SIS) tunnel junction 26, 28, 30 and 32. Optionally, each leg may have more than one SIS junction in order to improve performance of the circuit. Thus, the SIS junctions are in multiples of four.

Figure 3:
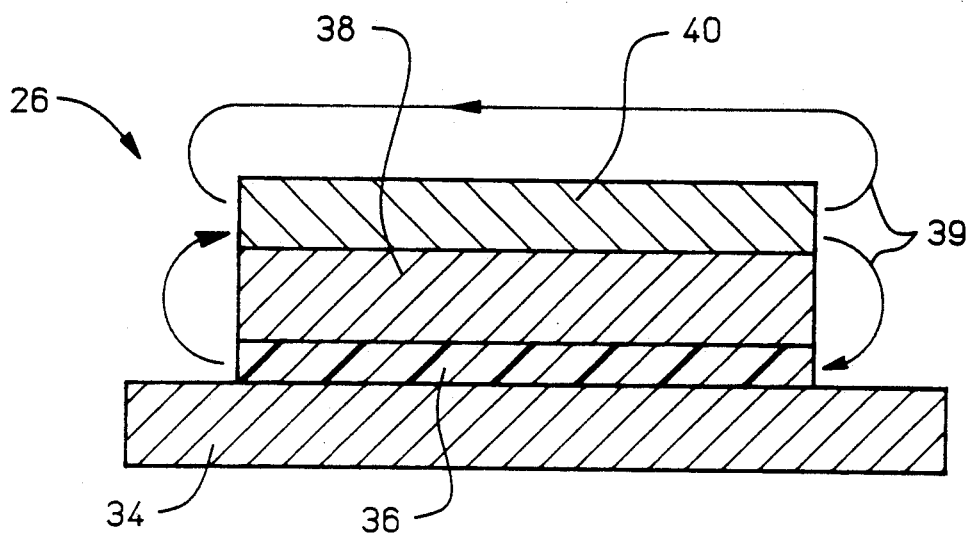
FIG. 3 is a side sectional view of a superconductor-insulator-superconductor (SIS) junction of FIG. 2.

The structure of an SIS junction 26 is shown in FIG. 3. As is conventional in the art, a base electrode 34 supports a tunnel barrier 36 and a counterelectrode 38. These three layers form the SIS sandwich of a standard Josephson junction. The material used to form the base electrode 34 and the counterelectrode 38 may be any type of superconductive material, but preferably is niobium. The junction dimensions are preferably less than 5 $\mu$m, but this is not critical. The tunnel barrier 36 may be an aluminum oxide barrier, but other insulating materials may be used.

Figure 1:
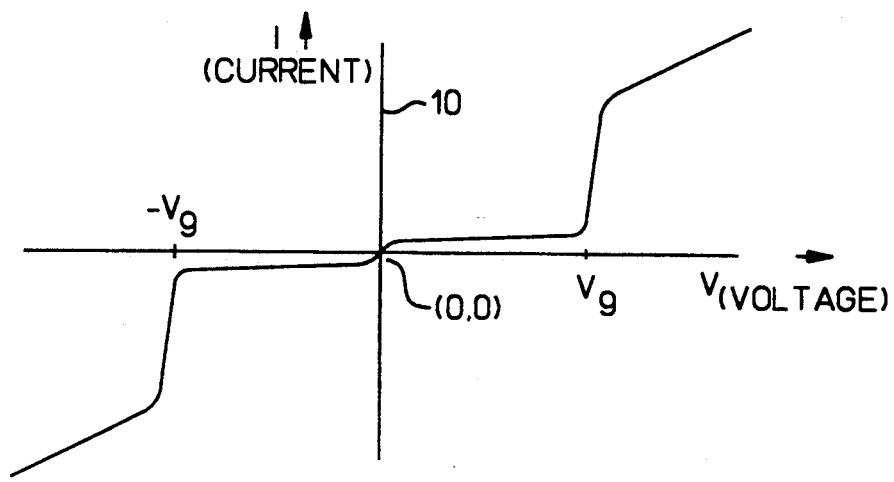
FIG. 1 is an illustration of the current-voltage characteristics of a Josephson junction used in a prior art track and hold circuit.

In the preferred embodiment of a niobium-aluminum oxide-niobium sandwich, the tunnel junction 26 exhibits the current-voltage (I-V) characteristic shown in FIG. 1. A superconducting, zero-voltage peak 10 is achieved when the current is below a critical current. The gap voltage ($V_g$) is approximately 3.0 mV.

A semi-permanent ferrite magnet 40 differentiates the SIS junction 26 of FIG. 3 from tunnel junctions used in prior art track and hold circuits. The magnet is a "microscopic" magnetic that is placed atop the tunnel junction 26. In a preferred embodiment, the microscopic magnet is approximately the same size as the SIS sandwich. As shown in FIG. 3, the microscopic magnet is disposed magnetically parallel to the sandwich, so that magnetic field lines 39 easily thread the tunnel barrier. Typical materials for use of the microscopic magnet are iron, nickel, magnetic garnets and ferrites.

The generation of a magnetic field 39 about the SIS junction 26, if sufficiently great, will destroy the superconducting behavior of the SIS junction. That is, the magnetic field will suppress the Josephson effect of the tunnel junction. In the present invention, the microscopic magnet 40 is used to suppress the Josephson effect, so that the SIS junction is limited to a resistive state. Referring to FIG. 1, the elimination of the zero-voltage peak 10 limits operation of the SIS junction to a high differential resistive behavior and a low differential resistive behavior. The high differential resistive behavior is between $-V_g$ and $+V_g$. This range is referred to as a subgap level. Outside of the subgap level low differential resistive behavior is exhibited, especially at the gap voltage. While as noted above other superconductive materials may be used, niobium is the preferred material because the knees at $\pm V_g$ are sharp, providing a clear distinction between high and low differential resistive behaviors.

Figure 4:
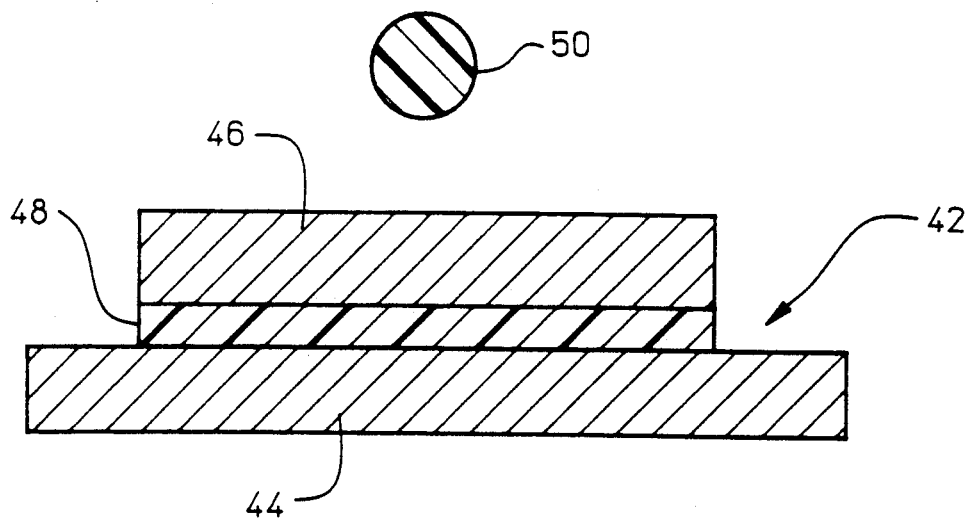
FIG. 4 is a side sectional view of a second embodiment of an SIS junction of FIG. 2.

Other ways of suppressing the Josephson effect in the tunnel junction 26 are available. For example, the one-to-one relationship of microscopic magnets 40 and SIS sandwiches may be replaced with a single global magnetic field applied to a chip containing the track and hold circuit and the A/D converter to which the circuit is coupled. However, the global magnetic field may also disrupt the desired Josephson currents in the Josephson tunnel junctions of the A/D converter. A more workable alternative is to use a control wire to suppress the Josephson effect. Referring to FIG. 4, an SIS junction 42 comprising first and second superconductor layers 44 and 46 sandwiching an insulator layer 48 is shown below a control wire 50 through which a sufficient current is conducted to suppress the Josephson effect. The control wire 50 may be above or below the junction 42. The use of a control wire is described in U.S. Pat. No. 3,936,809 to Zappe in use with a Josephson tunnel storage device for random access memory storage. While the control wire method may be used in the present invention, the microscopic magnet described above is preferred since in using the control wire the bridge configuration of SIS junctions may cause difficulties in completely suppressing Josephson currents with a small control current. In using junctions of the desired size, i.e. having a dimension of less than 5 $\mu$m, a large control current may be required, leading to heating problems due to the possibility of exceeding the current-carrying capability of the control wire.

Another alternative is to implant paramagnetic impurities within the tunnel barrier layer of each SIS junction in order to completely suppress the Josephson effect. While this approach of intrinsically destroying the Josephson effect offers operational advantages over the use of microscopic magnets as described above, the approach includes fabrication difficulties.

Figure 5:
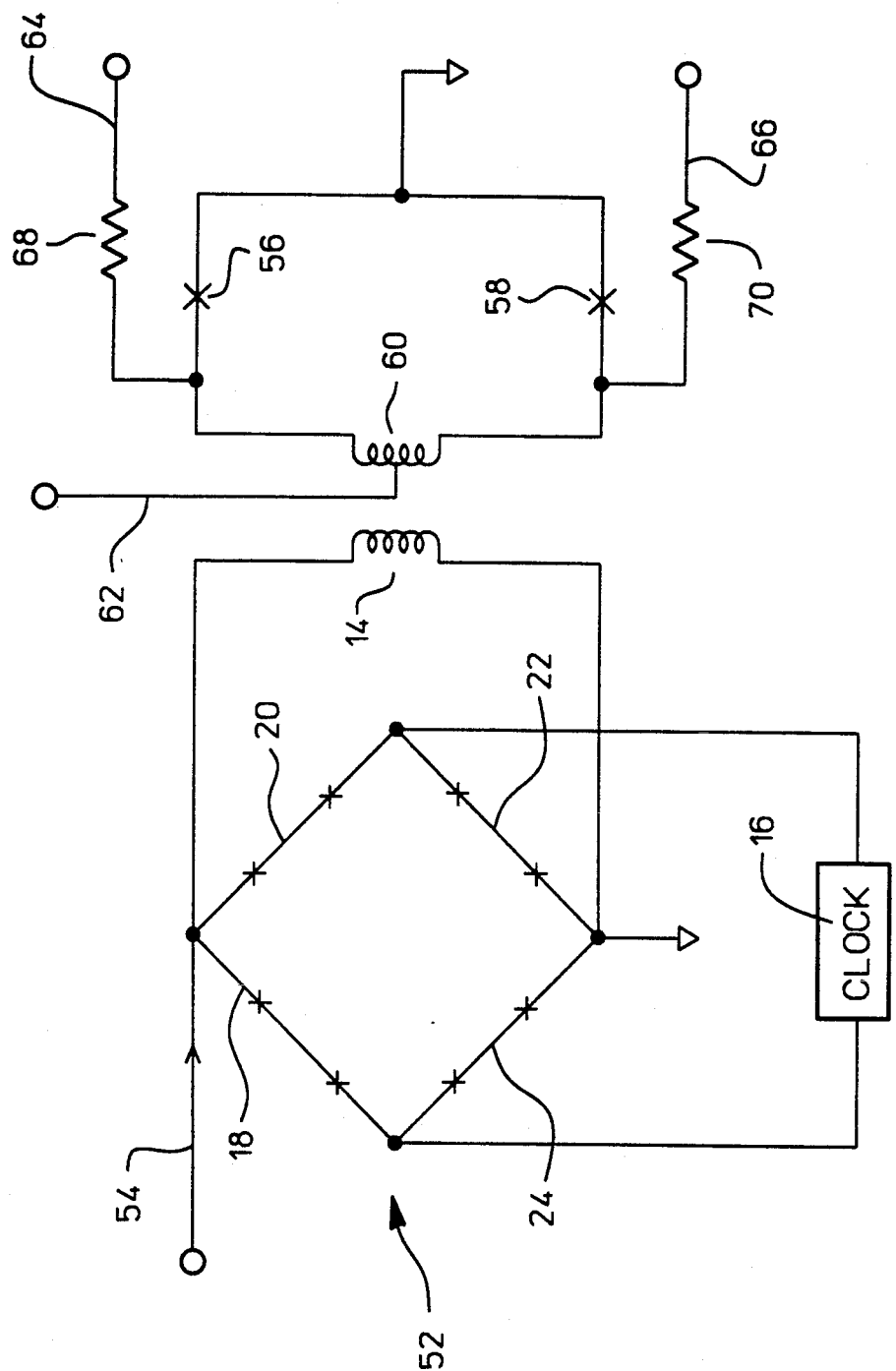
FIG. 5 is a schematic view of a second embodiment of a and hold circuit inductively coupled to a quantization circuit.

FIG. 5 illustrates the track and hold circuit inductively coupled to a superconducting quantizer. With the exception that each leg 18-24 of the bridge 52 includes two SIS junctions, the track and hold circuit is identical to the one described above. In a track mode an analog input signal is injected at line 54. The node opposite to the input node of the bridge 52 is at electrical ground. However, when no current is received from the clock input 16 coupled at the other two nodes of the bridge, the SIS junctions are at a subgap, high differential resistive level. As a consequence, the input signal is shunted to the storage inductor 14 rather than the bridge. The absence of clock current from the clock input 16 maintains the SIS junctions of each of the four legs 18-24 below the gap voltage, ensuring that the SIS junctions exhibit the high differential resistive behavior that sends the analog signal current through the storage inductance to ground.

In the hold mode, clock current from the clock input 16 causes the SIS junctions of each of the four legs 18-24 to simultaneously attain the gap voltage. The SIS junctions thereafter exhibit low differential resistive behavior. In FIG. 5, the input clock is a floating clock. During times in which current is injected at the connection of the first leg 18 and the fourth leg 24, clock current will be split between conducting from the first leg 18 to the second leg 20 for return to the clock input 16 and conducting from the fourth leg 24 to the third leg 22 for return to the clock input. If the clock input 16 has the opposite polarity, flow is again split, but in the opposite direction. The clock current is in the order of magnitude of two Josephson currents for the junctions, if they were unsuppressed. In the preferred embodiment, the unsuppressed Josephson currents would be approximately one milliamp, so that the clock current is approximately two milliamps. The frequency of the clock is not critical, and will depend upon the sampling rate of the A/D converter. The track and hold circuit is capable of multi-gigahertz sampling.

Regarding the analog input current along line 54 when the clock current has switched the SIS junctions of the bridge 52 to low differential resistive behavior, the signal current is independent of the clock current. During the hold time, the low impedance of the SIS junctions diverts current increments from entering the storage inductor 14. Thus the current through the storage inductance is fixed. For example if, after initiation of the hold mode, the analog signal to be converted has an incremental increase of 100 microamps, 50 microamps will be conducted through the first leg 18 and fourth leg 24 to ground, while the remaining additional 50 microamps will be conducted from the second leg 20 to the third leg 22 to ground.

Because even in the low differential resistive behavior the SIS junctions are not in a superconducting, zero-voltage state, there will be a slow leakage. However, the resistance of the SIS junctions is sufficiently low that the signal is held for ample time to perform quantization of the analog signal current. This is true even for rapidly slewing signals, e.g., nine bits at 2.5 GHz.

A loop that is formed by the bridge 52 and the storage inductor 14 during the hold mode is not a superconducting loop. As a result, the track and hold circuit is not subjected to the limitations of storage in magnetic flux quanta. Therefore, the linearity of the conversion and the resolution of the conversion do not become performance trade-offs.

When clock current from the clock input 16 places the track and hold circuit in hold mode, sampling by the superconducting quantizer can take place. The quantizer includes a superconducting loop formed by two Josephson junctions 56 and 58 and an inductor 60. The quantizer is a double-junction superconducting quantum interference device (SQUID). A current injected at line 62 to a center tap terminal of the inductor 60 is used to positively bias the Josephson junctions 56 and 58 from a superconducting, zero-voltage state to a resistive, voltage state. The inductor is inductively coupled to the track and hold circuit. Positive incremental changes in the analog signal current generate a voltage pulse across the upper Josephson junction 56, while negative incremental changes in the analog signal current generate voltage pulses across the lower Josephson junction 58. By means of output lines 64 and 66 that include resistors 68 and 70, the pulses from the SQUID are connected to circuitry for generating a digital word representing a sampled analog signal. For example, output lines 64 and 66 may be connected to counters, with output line 64 providing a count-up signal and output line 66 providing a count-down signal.

The type of quantization circuitry employed with the track and hold circuit of the present invention is not critical. In fact, the track and hold circuit may be employed in other applications in which track and hold operation is desirable.

Figure 6:
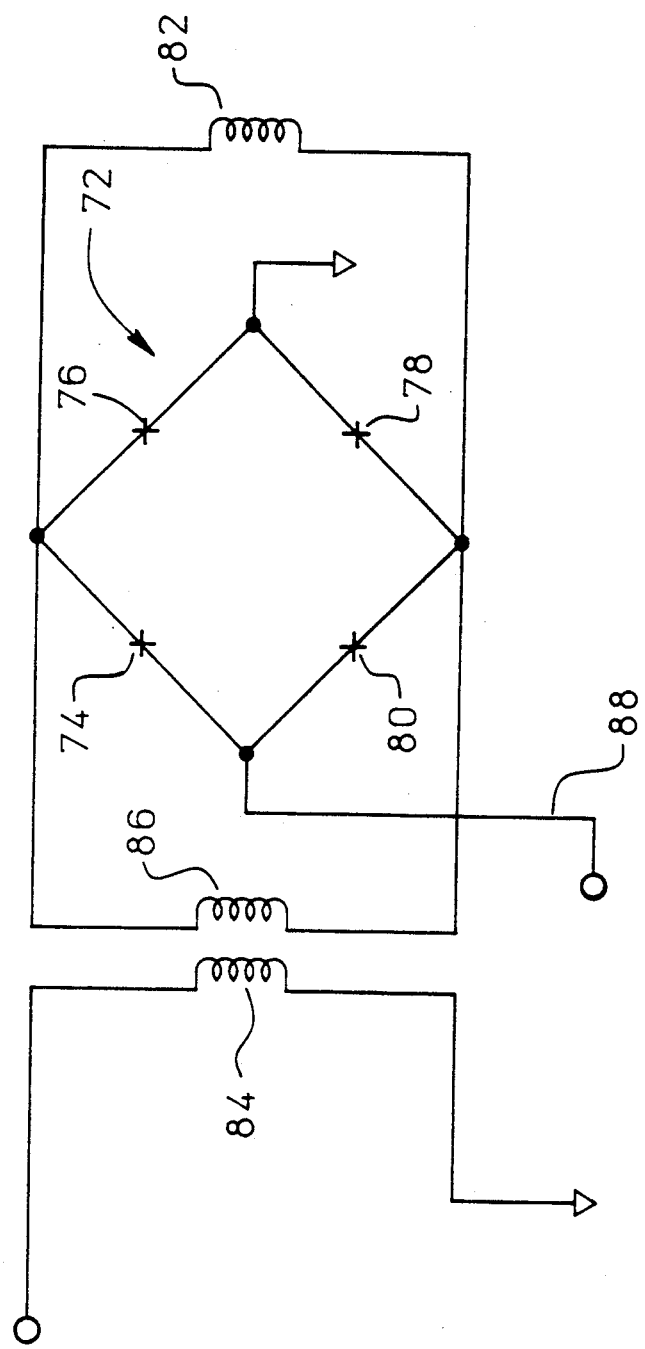
FIG. 6 is a schematic view of a third embodiment of a track and hold circuit in accordance with the present invention.

Referring now to FIG. 6, another embodiment of a track and hold circuit in accordance with the present invention is shown. Again, a bridge 72 having four SIS junctions 74, 76, 78 and 80 is employed to selectively hold an analog signal current level at a storage inductor 82. The analog signal is inductively coupled to the track and hold circuit at members 84 and 86. In a track mode, there is no input at a clock current line 88. The suppressed SIS junctions 74-80 exhibit high differential resistive behavior because each junction is at a subgap voltage level. The high impedance of the SIS junctions causes the analog signal current to conduct through the storage inductor 82. Thus, the inductor member 86 and the storage inductor 82 form a loop.

In the hold mode clock current is injected at line 88. The clock current is at a sufficient level to cause the SIS junctions 74-80 to attain their gap voltage, switching the tunnel junctions to low differential resistive behavior. The clock current is split between legs 74 and 80 and is channeled to ground via legs 76 and 78. This causes the bridge 72 to be an analog signal current path that is preferred to the path through the inductor 82. Changes in the analog signal current following initiation of the hold mode are divided between a path that includes SIS junctions 74 and 80 and a path that includes SIS junctions 76 and 78. The direction of current flow is dependent upon whether the current change is an increase or decrease. Optimum bandwidth occurs when inductor members 82, 84 and 86 have comparable inductances, e.g. 200 picohenries, resulting in a reduction in signal current transferred to the storage inductor 82 by a factor of 2. However, this is not critical.

I claim:

1. A track and hold circuit for an input signal to be sampled comprising,
   a plurality of superconductor-insulator-superconductor (SIS) junctions interconnected to form a bridge, each SIS junction having a current-voltage characteristic exhibiting high differential resistance behavior and low differential resistance behavior, said bridge having an input node to receive an input signal,
   continuous magnetic means for uninterrupted suppression of superconducting, zero-resistance behavior of said SIS junctions, thereby limiting said SIS junctions to exhibiting said high and low differential resistive behaviors,
   inductance means coupled to said input node for loading an input signal received at said input node, and
   current-steering means coupled to said bridge for controlling current flow form said input node to each of said bridge and said inductance means, said current-steering means alternating said SIS junctions between said high differential resistive behavior in a track mode and said low differential resistive behavior in a hold mode, said track mode thereby diverting said current flow into said inductance means, said hold mode diverting said current flow away from said inductance means.

2. The circuit of claim 1 wherein said means for suppressing is a control wire.

3. The circuit of claim 1 wherein said current-steering means is a clock circuit.

4. A track and hold circuit comprising,
   a bridge having first, second, third and fourth tunnel junctions, each tunnel junction having a resistive state that includes high impedance behavior when said tunnel junction is in a subgap voltage condition and low impedance behavior when said tunnel junction has attained a gap voltage, said bridge having first, second, third and fourth nodes at the connections of said tunnel junctions,
   means for applying a magnetic field to said tunnel junctions to continuously prevent said tunnel junctions from switching from said resistive state to a superconducting, zero-voltage state,
   input means coupled to said first node for injecting an input signal,
   means coupled to said first and third nodes for loading said input signal, and clock means connected to said second node for injecting a current to selectively and simultaneously change said tunnel junctions between exhibiting said high impedance behavior and said low impedance behavior, wherein said high impedance behavior provides a track mode and said low impedance behavior provides a hold mode for storing current at said means for loading.

5. The circuit of claim 4 wherein said tunnel junctions are each superconductor-insulator-superconductor junctions.

6. The circuit of claim 4 wherein said bridge has four legs, each leg having a tunnel junction, said legs being connected at said nodes, said clock means being a floating clock connected to said second and fourth nodes.

7. The circuit of claim 4 wherein said fourth node is grounded, thereby allowing extraction of said current of said clock means, said first and third nodes being floating, said input means to said first and third nodes being a superconducting transformer.

8. The circuit of claim 4 wherein said means for applying a magnetic field is a plurality of permanent magnets disposed adjacent to said tunnel junctions.

9. The circuit of claim 5 wherein said means for applying a magnetic field is an implantation of paramagnetic impurities in a superconductor layer of each superconductor-insulator-superconductor junction.

10. The circuit of claim 4 wherein said load means is an inductor.

11. A track and hold circuit for a superconducting analog-to-digital converter comprising, an analog input line, a bridge circuit having first, second, third and fourth legs, each leg having at least one superconductor-insulator-superconductor (SIS) junction, said first leg connected to said fourth leg at a first node and connected to said second leg at a second node, said third leg connected to said second leg at a third node and connected to said fourth leg at a fourth node, said analog input line coupled to said first node, load means connected to said first and third nodes for loading said analog input line, clock means connected to said second node for operating each SIS junction in a high impedance condition and alternatively in a low impedance condition, said clock means providing corresponding and simultaneous alternation of each SIS junction between said high and low impedance conditions, magnetic means for inhibiting said SIS junctions from entering a superconducting, zero-voltage state, thereby limiting said SIS junctions to said high and low impedance conditions, and a superconducting quantizer inductively coupled to said load means, wherein said magnetic means prevents said coupling of said bridge circuit and said load means from reaching a superconducting quantization condition.

12. The circuit of claim 11 wherein said load means is an inductor.

13. The circuit of claim 11 wherein said magnetic means is a plurality of magnets disposed adjacent to said SIS junctions.

14. A track and hold circuit for an input signal to be sampled comprising, a plurality of superconductor-insulator-superconductor (SIS) junctions interconnected to form a bridge, each SIS junction having a current-voltage characteristic exhibiting high differential resistance behavior and low differential resistance behavior, said bridge having an input node to receive an input signal, magnetic means for continually suppressing superconducting, zero-resistance behavior of said SIS junctions, thereby limiting said SIS junctions to exhibiting said high and low differential resistive behaviors, inductance means coupled to said input node for loading an input signal received at said input node, and current-steering means coupled to said bridge for controlling current flow from said input node to each of said bridge and said inductance means, said current-steering means alternating said SIS junctions between said high differential resistive behavior in a track mode and said low differential resistive behavior in a hold mode, said track mode thereby diverting said current flow into said inductance means, said hold mode diverting said current flow away from said inductance means, wherein the number of said SIS junctions is a multiple of four, said SIS junctions being electrically connected to provide oppositely disposed second and fourth nodes and to provide a third node opposite to said input node, said inductance means connected to said input node and to said third node.

15. The circuit of claim 14 wherein sad current-steering means is a current source coupled to direct current between said second node and said fourth node, said SIS junctions associated with a gap voltage ($V_g$), said current source selectively providing current such that said $V_g$ is attained, thereby switching said SIS junctions from said high differential resistive behavior to said low differential resistive behavior.

16. A track and hold circuit for an input signal to be sampled comprising, a plurality of superconductor-insulator-superconductor (SIS) junctions interconnected to form a bridge, each SIS junction having a current-voltage characteristic exhibiting high differential resistance behavior and low differential resistance behavior, said bridge having an input node to receive an input signal, a plurality of permanent magnets disposed to subject said SIS junctions to a magnetic field strength sufficient to suppress superconducting, zero-resistance behavior of said SIS junctions, thereby limiting said SIS junctions to exhibiting said high and low differential resistive behaviors, inductance means coupled to said input node for loading an input signal received at said input node, and current-steering means coupled to said bridge for controlling current flow from said input node to each of said bridge and said inductance means, said current-steering means alternating said SIS junctions between said high differential resistive behavior in a hold mode, said track mode thereby diverting said current flow into said inductance means, said hold mode diverting said current flow away from said inductance means.

17. The circuit of claim 16 wherein said permanent magnets are disposed magnetically parallel to said SIS junctions.

18. The circuit of claim 16 wherein said permanent magnets are approximately equal to size to said SIS junctions.

* * * * *